(12) United States Patent
Miller et al.

(10) Patent No.: US 6,583,476 B1
(45) Date of Patent: Jun. 24, 2003

(54) ELECTROSTATIC DISCHARGE PROTECTION FOR INTEGRATED SEMICONDUCTOR DEVICES USING CHANNEL STOP FIELD PLATES

(75) Inventors: Douglas Miller, San Jose, CA (US); Shekar Mallikarjunaswamy, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 10/187,224

(22) Filed: Jun. 28, 2002

(51) Int. Cl.[7] .............................................. H01L 23/62
(52) U.S. Cl. ....................................... 257/355; 257/367
(58) Field of Search ................................ 257/355, 364, 257/367

(56) References Cited

U.S. PATENT DOCUMENTS 5,903,420 A * 5/1999 Ham ............................ 361/56
6,144,070 A * 11/2000 Devore et al. ............... 257/343

FOREIGN PATENT DOCUMENTS

GB           2210197 A   *  6/1989   ............ H01L/27/04

* cited by examiner

Primary Examiner—Allan R. Wilson
(74) Attorney, Agent, or Firm—Patent Law Group LLP; Carmen C. Cook

(57) ABSTRACT

A semiconductor structure which protects against damages to an integrated circuit caused by electrostatic discharge (ESD) at a power supply pin includes a channel stop field plate coupled between a power supply terminal associated with the power supply pin and contacts to N-type substrate or N-wells formed in the semiconductor structure receiving the power supply voltage. The field plate functions to inhibit surface leakage current and is also used to introduce a resistance between the power supply pin and connections to N-wells or the N-substrate, thereby providing protection to the wells or substrate against damages caused by an ESD event. By exploiting an existing structure used in typical integrated circuit for ESD protection, ESD immunity of a semiconductor device can be enhanced without consuming additional silicon area.

19 Claims, 3 Drawing Sheets

ELECTROSTATIC DISCHARGE PROTECTION FOR INTEGRATED SEMICONDUCTOR DEVICES USING CHANNEL STOP FIELD PLATES

FIELD OF THE INVENTION

The invention relates to a structure and a method for protecting an integrated circuit against internal circuit damages caused by electrostatic discharge (ESD) and, in particular, to a method for providing ESD protection at the power supply pins using channel stop field plates.

DESCRIPTION OF THE RELATED ART

Electrostatic discharge (ESD) is a well-known concern when designing an integrated circuit (IC). ESD events can occur at the input/output pads of an IC or the power supply pins. The ESD spikes can reach up to several thousand volts and can destroy circuitry within an IC, such as field effect transistors (FETs). When an ESD event occurs at an input/output pad of an IC, the resulting damages, such as leakage or shorts of the input/output pins, are usually localized at the input/output pad or nearby circuitry. However, when an ESD event occurs at the power supply pins, damages to the internal circuitry of the IC can result.

FIG. 1 is a cross-sectional view of a conventional semiconductor device fabricated using a BiCMOS process for illustrating the effect of an ESD event at a power supply pin. Referring to FIG. 1, semiconductor device 10 is fabricated on a P-type substrate 12. In a BiCMOS process using a P-type substrate, junction isolation is typically used to isolate the passive and active devices. For instance, p-type devices are placed in N-wells while n-type devices can be placed directly in the substrate or in P-wells if a twin-well process is used. N-wells in a P-type substrate are connected to the highest voltage supply of the integrated circuit, such as the Vdd voltage, to ensure that the wells are reversed biased with respect to the substrate.

In FIG. 1, semiconductor device 10 includes a p-type diffusion resistor 15 and is isolated from P-type substrate 12 by an N-well 14. N-well 14 includes n+ diffusion regions 20 for electrically connecting N-well 14 to the most positive power supply of the semiconductor device which in the present illustration is the Vdd voltage. Diffusion resistor 15 is formed by a P-well 16 formed inside N-well 14. Two p+ diffusion regions 18 provide the resistor terminals R1 and R1'. Note that the cross-sectional view of semiconductor 10 is simplified for ease of description. One of ordinary skill in the art would appreciate that semiconductor device 10 may include other structures and layers to facilitate the electrical connections of the different diffusion regions in the device.

When an ESD event occurs on the Vdd pin of semiconductor device 10, the ESD energy can cause junction damage at the n+ diffusion regions 20, resulting in shorting between the n+ regions and the p+ regions of diffusion resistor 15 and ultimately destroying the resistor. Thus, an ESD event at the power supply pin can cause damages to internal circuitry of an IC.

It is known to include a large resistance in series between the power supply terminal and the N-well contacts to provide ESD protection of the N-wells. Such resistance is typically added by connecting a resistor to the power supply pad. The inclusion of such resistors consumes silicon real estate and ultimately increases the size of the integrated circuit.

It is desirable to provide ESD protection of the power supply pin in an integrated circuit while minimizing the layout area of the integrated circuit.

SUMMARY OF THE INVENTION

According to one embodiment of the present invention, a semiconductor structure formed in a semiconductor substrate of a first conductivity type for protecting against electrostatic discharge includes a first well of a second conductivity type formed in the substrate and having a first dopant concentration, a first region formed in the first well where the first region is of the second conductivity type and has a second dopant concentration greater than the first dopant concentration, an oxide region formed in and above a top surface of the semiconductor substrate where the oxide region encircles an active region in which one or more circuit elements are formed, and a field plate formed on the oxide region and encircling the active region. The field plate has a first end and a second end, where the first end of the field plate is coupled to a first power supply terminal and the second end of the field plate is coupled to the first region.

In operation, the field plate is used to introduced a resistance between the power supply pin and connections to N-wells or the N-substrate, thereby providing protection to the wells or substrate against damages caused by an ESD event.

The present invention is better understood upon consideration of the detailed description below and the accompanying drawings.

DETAILED DESCRIPTION OF THE PREFERRED EMBODIMENTS

In accordance with the principles of the present invention, a semiconductor structure which protects against damages to an integrated circuit caused by electrostatic discharge (ESD) at a power supply pin includes a channel stop field plate coupled between a power supply terminal associated with the power supply pin and wells formed in the substrate of the semiconductor structure receiving the power supply voltage. The field plate functions as a channel stop for inhibiting surface leakage current, such as between p-type diffusion regions formed in N-wells to the substrate, and also functions to introduce resistance between the power supply pin and the wells so as to provide ESD protection. In this manner, ESD protection of the power supply pin is realized by using an existing structure in typical semiconductor devices and effective ESD protection can be provided without requiring additional silicon area.

In accordance with the present invention, ESD protection at the power supply terminal is provided by exploiting an existing structure used in integrated circuit design. Therefore, no additional silicon area is required to reap the benefit of enhanced ESD protection. Furthermore, the ESD protection structure and method of the present invention is readily adaptable to existing IC designs where ESD protection enhancement is desired. In the present embodiment, the resistance of the channel stop field plate is advantageously utilized to limit the ESD current at the power supply terminal due to an ESD event so that junctions formed in wells are protected from ESD spikes.

In the following description, the term "power supply pin" has a meaning commonly used in the art of integrated circuits. That is, the power supply pin can be used to refer to both the Vdd pin and the Vss pin of an integrated circuit. Furthermore, the power supply pin can be used to refer to either a Vss pin at the ground voltage (0 Volt) or a Vss pin at a negative voltage.

Figure 1:
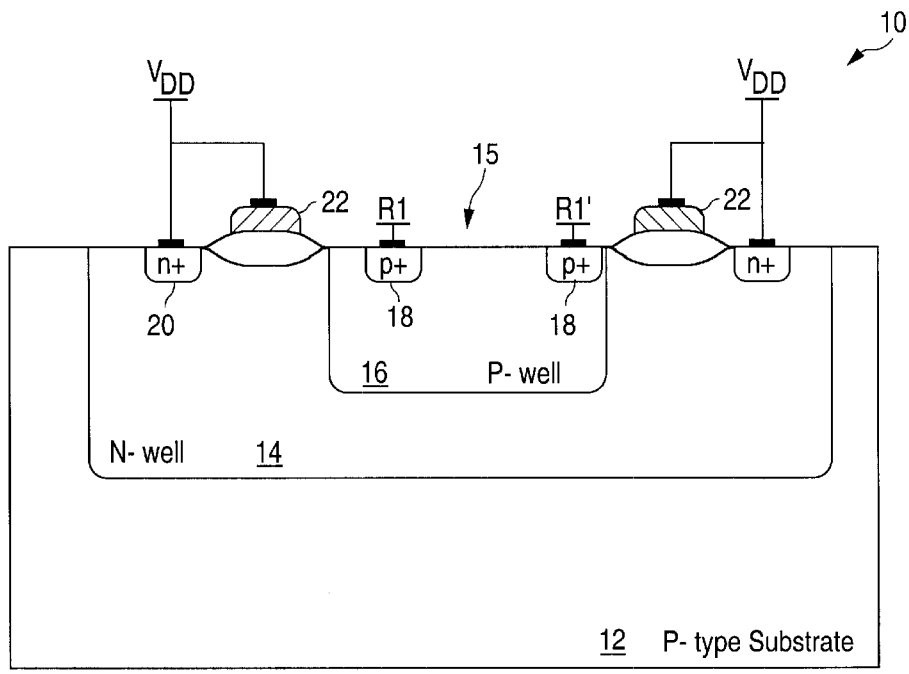
FIG. 1 is a cross-sectional view of a conventional semiconductor device fabricated using a CMOS process.

In integrated circuits where devices are isolated in individual or common wells, channel stop field plates are used to inhibit surface leakage currents between passive or active semiconductor devices constructed in the wells. Referring to FIG. 1, surface leakage under the field oxide can occur when a high voltage metal interconnect line crosses over the field oxide layer between P-well 16 and P-substrate 12. Such leakage current degrades the performance of diffusion resistor 15. To inhibit the flow of the surface leakage current, it is known to use a channel stop field plate 22 over the field oxide layer and surrounding P-well 16. Field plate 22 is typically a thin film of conductive material, such as metal, polysilicon or SIPOS. Field plate 22 is connected to the most positive power supply of the IC, such as the Vdd voltage, usually through the well contacts as shown in FIG. 1. Field plate 22 can also be connected to the most positive voltage of the well in which the field plate is placed. In accordance with the present invention, the field plate included in conventional integrated circuits for inhibiting leakage current is electrically reconfigured to function as a serial resistor for protecting the IC against an ESD event at the power supply pin, as will be described in more detail below.

Figure 2:
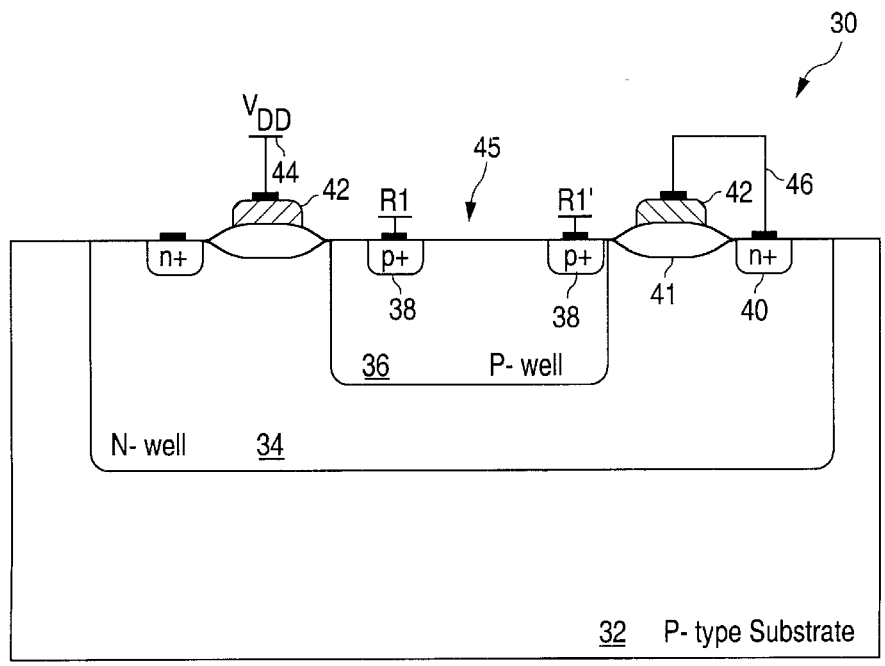
FIG. 2 is a cross-sectional view of a semiconductor device incorporating the ESD protection structure according to one embodiment of the present invention.

FIG. 2 is a cross-sectional view of a semiconductor device incorporating the ESD protection structure according to one embodiment of the present invention. Referring to FIG. 2, semiconductor device 30 is fabricated on a P-type substrate 32 and includes an N-well 34 in which a p-type diffusion resistor 45 is formed. Resistor 45 is formed in a P-well 36 where p+ diffusion regions 38 are formed as resistor terminals R1 and R1'. P-well 36, the active area for resistor 45, is defined by a field oxide layer 41. N-well 34 includes n+ diffusion regions 40 for electrically biasing the N-well. Semiconductor device 30 further includes a channel stop field plate 42 formed above field oxide layer 41. In the present embodiment, field plate 42 is a polysilicon layer. Field plate 42 functions to inhibit surface leakage current from flowing between p+ diffusion regions 38 and P-substrate 32.

In accordance with the present embodiment of the present invention, N-well 34, which is to be electrically coupled to the most positive power supply of semiconductor device 30, is not connected directly to the power supply terminal (node 44). Instead, the power supply terminal (node 44) is first coupled to one end of field plate 42. As shown in FIG. 2, the other end of field plate 42 is coupled to N-well 34 through n+ diffusion region 40, such as by use of a metal layer. In this manner, N-well 34 is electrically coupled to the power supply terminal through field plate 42 which includes a large resistance path in series with the power supply terminal. The resistance derived by field plate 42 protects N-well 34 from ESD events occurring at the power supply terminal.

Note that FIG. 2 is a representative cross-sectional view of semiconductor device 30 and has been simplified to ease the present discussion. One of ordinary skill in the art would appreciate that in typical semiconductor fabrication processes, electrical contacts to diffusion regions 38 and 40 and to field plate 42 are made by defining contacts holes in an overlaying dielectric layer and then connecting the contacts using a conductive material, such as a metal layer, which contact holes and metal layer are not shown in FIG. 2. Furthermore, the Vdd terminal, denoted by node 44, is representative of one or more conductive lines used to electrically couple the power supply voltage Vdd from the power supply pin to the internal circuitry of the semiconductor device. Thus, node 44 is representative of any nodes in an integrated circuit directly receiving the power supply voltage from the power supply pin and is thus subject to damages caused by ESD events at the power supply pin. Lastly, features in FIG. 2 are illustrative only and are not drawn to scale.

Figure 3:
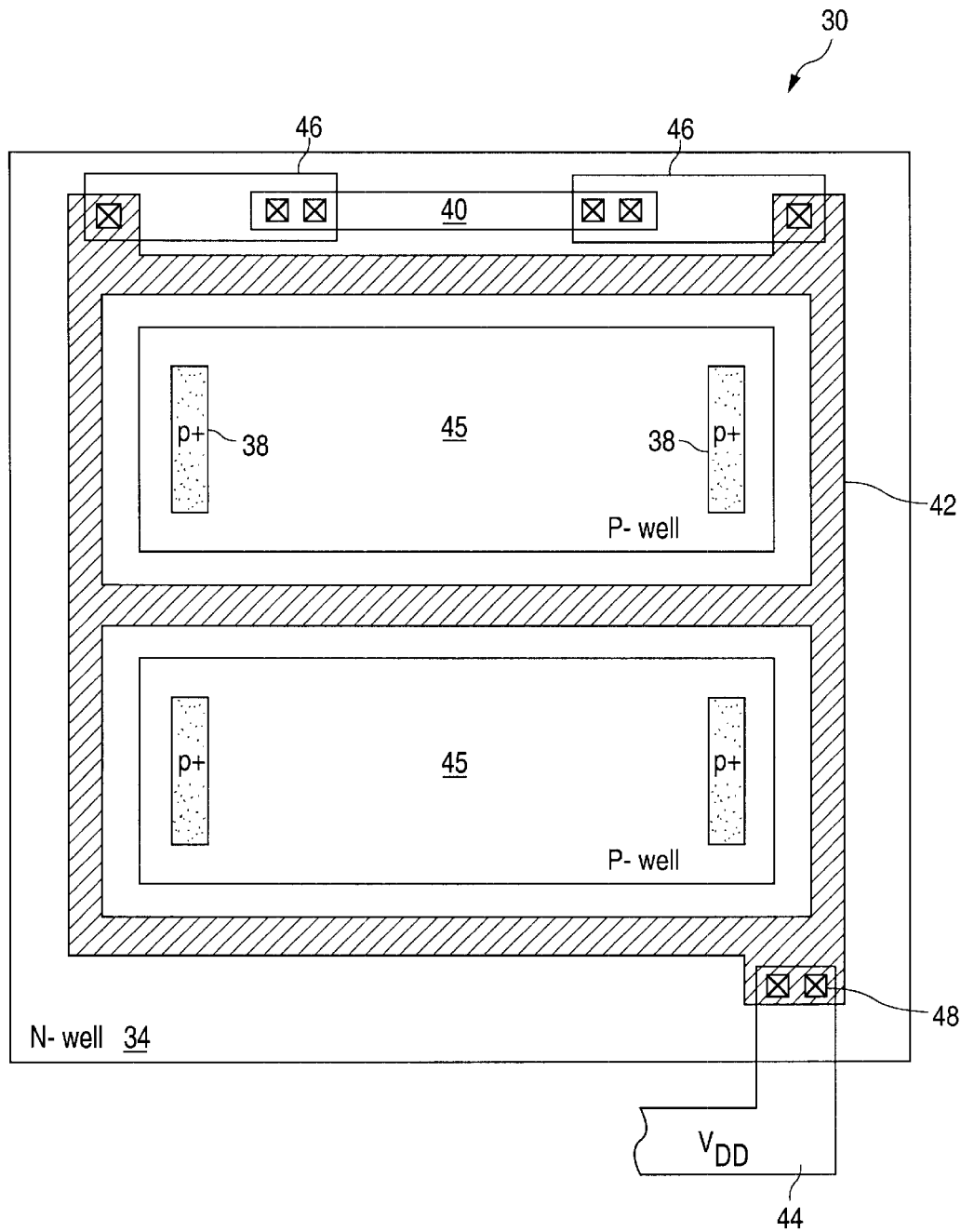
FIG. 3 is a top view of the semiconductor device of FIG. 2 according to one embodiment of the present invention.

FIG. 3 is a top view of semiconductor device 30 according to one embodiment of the present invention. Like elements in FIGS. 2 and 3 are given like reference numerals to simplify the discussion. In FIG. 3, semiconductor device 30 includes two diffusion resistors 45 both fabricated in N-well 34. Field plate 42 encircles both legs of diffusion resistor 45. In the present embodiment, the power supply voltage Vdd is coupled to one end of field plate 42 through contacts 48. At the other end of field plate 42, metal lines 46 connect field plate 42 to n+ diffusion region 40 of N-well 34, thereby electrically coupling the power supply voltage Vdd to the N-well. However, the length of the field plate through which the Vdd voltage passes introduces resistance for protecting N-well 34 against ESD events at the power supply pin. In the present embodiment, field plate 42 is a polysilicon layer and a resistance value of greater than 1 kohms can be attained. The value of the resistance is dependent on the layout and shape of field plate 42.

By coupling the power supply voltage to connections in the silicon substrate through a field plate which introduces resistance, ESD immunity of the semiconductor device can be significantly enhanced. The resistance added by the field plate can protect n+ diffusion regions connected to the Vdd voltage against junction damages caused by an ESD event. More importantly, because the enhanced ESD protection is realized by using an existing structure in the circuit layout of the semiconductor device, no additional silicon real estate is required to implement the ESD protection enhancement. Thus, an integrated circuit can preserve its compact layout while meeting ESD immunity requirements.

In the present description, semiconductor device 30 includes a p-type diffusion resistor 45. The use of a diffusion resistor 45 in semiconductor device 30 is illustrative only. The ESD protection structure and method of the present invention can be applied to other types of integrated semiconductor devices, including passive or active circuit elements where the circuit elements are isolated in an N-well and a channel stop field plate is incorporated or can be incorporated for inhibiting surface leakage current.

Figure 4:
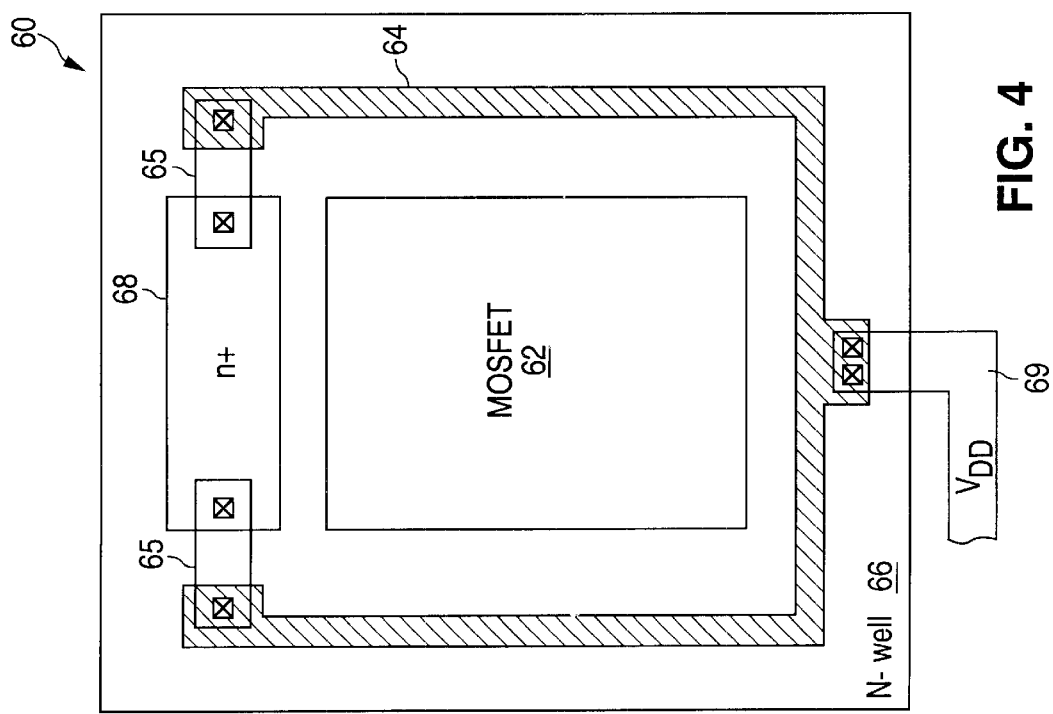
FIG. 4 is a top view of a semiconductor device incorporating a MOSFET transistor according to one embodiment of the present invention.

Thus, in an alternate embodiment of the present invention, the ESD protection structure of the present invention is applied to protect the power supply connection to an N-well containing a metal-oxide-silicon field effect transistor (MOSFET) transistor, as shown in FIG. 4. Referring to FIG. 4, a p-type MOS transistor 62 is formed in an N-well 66. A field plate 64 is formed on top of a field oxide layer encircling the active area in which transistor 62 is formed. In a conventional MOSFET, N-well 66 will be directly connected to the power supply terminal through an n+ diffusion region 68. However, in accordance with the present embodiment of the present invention, the power supply terminal (node 69) is first connected to one end of field plate 64. Then, the other end of field plate 64 is connected to n+ diffusion region 68 through metal lines 65. In this manner, a large resistance is introduced between the power supply terminal and N-well 66 where the N-well is protected against damages caused by ESD events at the power supply pin.

Figure 5:
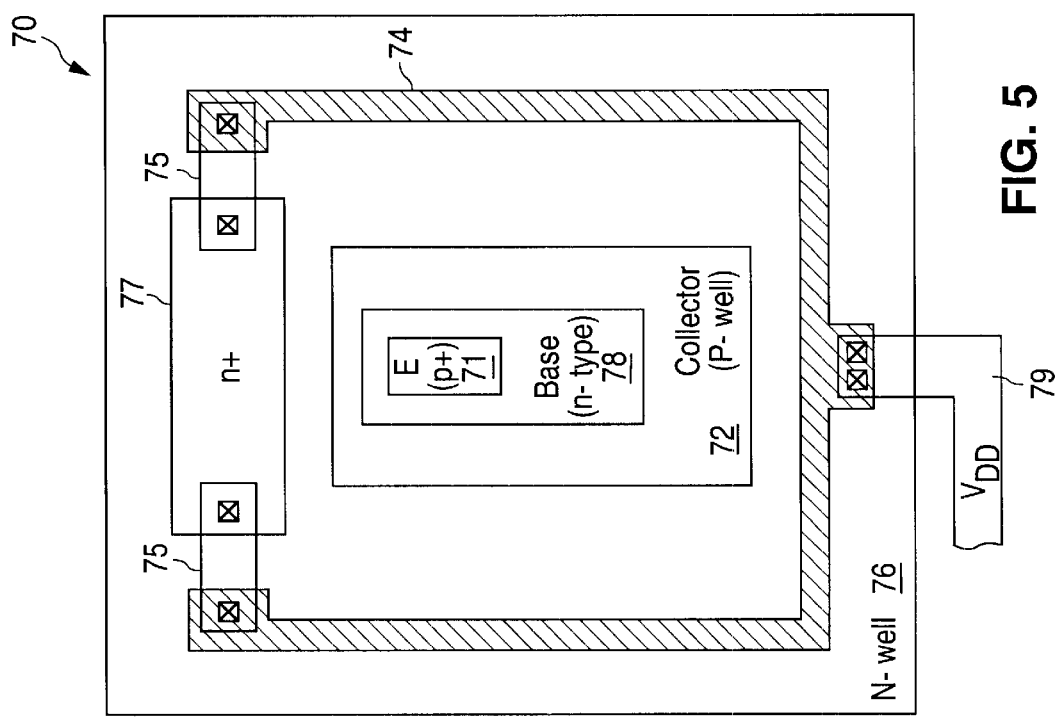
FIG. 5 is a top view of a semiconductor device incorporating a bipolar transistor according to one embodiment of the present invention.

In yet another embodiment of the present invention, the ESD protection structure of the present invention is applied to protect a bipolar transistor from damages caused by ESD, as shown in FIG. 5. Referring to FIG. 5, semiconductor device 70 includes a PNP bipolar transistor formed in an N-well 76. The collector terminal for the transistor is formed in a P-well 72 formed in the N-well 76. The base terminal is formed in an n-type diffusion region 78 inside P-well 72. Finally, the emitter terminal is formed in a p+ diffusion region 71 in n-type diffusion region 78. Semiconductor device 70 includes a field plate 74 formed on a field oxide layer surrounding P-well 72. In the present embodiment, N-well 76 is protected from damages caused by ESD events at the power supply pin by connecting the power supply terminal (node 79) to one end of field plate 74. Then, the other end of field plate 74 is connected to N-well 76 through n+ diffusion region 77. In the present embodiment, field plate 74 is connected to n+ diffusion region 77 through metal lines 75. In this manner, a large resistance is introduced between the power supply terminal and the N-well and effective ESD immunity is realized.

While in the above description, the ESD protection structure and method of the present invention are applied to semiconductor devices including diffusion resistors, MOSFETs and bipolar transistors, the ESD protection structure and method of the present invention can be applied to other active and passive circuit elements not mentioned above. The aforementioned circuit elements are illustrative only and are not intended to be limiting. In fact, the ESD protection structure and method of the present invention can be applied to any circuit design to protect substrate or wells from damages caused by ESD events occurring at the power supply pin. The ESD protection structure and method can be applied whenever the well or substrate is used for device isolation only. That is, the well or substrate is designed not to carry any current during normal device operation. Furthermore, the ESD protection structure and method can be applied whenever a field plate is or can be incorporated for inhibiting surface leakage between the wells/substrate and the active regions.

The above detailed descriptions are provided to illustrate specific embodiments of the present invention and are not intended to be limiting. Numerous modifications and variations within the scope of the present invention are possible. For example, the ESD protection structure and method of the present invention can be applied to a semiconductor device regardless of the polarity of the power supply pins and the associated wells or substrate the power supply pins are connected to. The above embodiments describe applying the ESD protection structure and method of the present invention to protect against damages to N-wells in P-substrate caused by ESD events at the Vdd pins. However, in other embodiments, the ESD protection method and structure of the present invention can be applied to protection against damages to P-wells in N-substrate caused by ESD events at the ground pin. Specifically, a channel field plate encircling a P-well can be electrically coupled to provide a large resistance between the ground pin and contacts to the P-well in accordance with the present invention, so as to achieve enhanced ESD immunity. The present invention is defined by the appended claims.

We claim:

1. A semiconductor structure formed in a semiconductor substrate of a first conductivity type for protecting against electrostatic discharge comprising:

a first well of a second conductivity type formed in said substrate and having a first dopant concentration;

a first region formed in said first well, said first region being of said second conductivity type and having a second dopant concentration greater than said first dopant concentration;

an oxide region formed in and above a top surface of said semiconductor substrate, said oxide region encircling an active region in which one or more circuit elements are formed; and a field plate formed on said oxide region and encircling said active region, said field plate having a first end and a second end, wherein said first end of said field plate is coupled to a first power supply terminal and said second end of said field plate is coupled to said first region.

2. The semiconductor structure of claim 1, wherein said field plate provides a resistance in series between said first power supply terminal and said first well and functions as a channel stop for said semiconductor structure.

3. The semiconductor structure of claim 1, wherein said first power supply terminal is coupled to an input pad of said semiconductor structure for receiving a power supply voltage for said semiconductor structure.

4. The semiconductor structure of claim 3, wherein said power supply voltage comprises a Vdd voltage of said semiconductor structure.

5. The semiconductor structure of claim 3, wherein said power supply voltage comprises a Vss voltage of said semiconductor structure.

6. The semiconductor structure of claim 5, wherein said Vss voltage comprises a ground voltage.

7. The semiconductor structure of claim 1, wherein said field plate comprises a polysilicon layer.

8. The semiconductor structure of claim 1, wherein said field plate comprises a metal layer.

9. The semiconductor structure of claim 1, wherein said first conductivity type is p-type and said second conductivity type is n-type.

10. The semiconductor structure of claim 1, further comprising:

a second well of said first conductivity type formed in said first well; and a second region and a third region formed in said second well, said second and third regions being of said first conductivity type and having a dopant concentration greater than a dopant concentration of said second well;

wherein said second well forms a diffusion resistor and said second region and third region form terminals of said diffusion resistor.

11. The semiconductor structure of claim 1, further comprises a metal-oxide-silicon field effect transistor formed in said active region.

12. A semiconductor structure formed in a semiconductor substrate of a first conductivity type for protecting against electrostatic discharge comprising:

a first well of a second conductivity type formed in said substrate and having a first dopant concentration;

a first region formed in said first well, said first region being of said second conductivity type and having a second dopant concentration greater than said first dopant concentration;

a second well of said first conductivity type formed in said first well, said second well forming a collector region of a transistor;

a second region of said second conductivity type formed in said second well, said second region having a dopant concentration greater than a dopant concentration of said second well and forming a base region of said transistor;

a third region of said first conductivity type formed in said second region, said third region having a dopant concentration greater than a dopant concentration of said second region and forming an emitter region of said transistor;

an oxide region formed in and above a top surface of said semiconductor substrate, said oxide region encircling said second well; and a field plate formed on said oxide region and encircling said second well, said field plate having a first end and a second end, wherein said first end of said field plate is coupled to a first power supply terminal and said second end of said field plate is coupled to said first region.

13. The semiconductor structure of claim 12, wherein said first power supply terminal is coupled to an input pad of said semiconductor structure for receiving a Vdd voltage for said semiconductor structure.

14. The semiconductor structure of claim 12, wherein said first power supply terminal is coupled to an input pad of said semiconductor structure for receiving a Vss voltage of said semiconductor structure.

15. The semiconductor structure of claim 14, wherein said Vss voltage comprises a ground voltage.

16. A method for providing electrostatic discharge protection to a semiconductor device formed in a semiconductor substrate of a first conductivity type, said semiconductor device comprising a first well of a second conductivity type and having a first dopant concentration, a first region of said second conductivity type formed in said first well and having a second dopant concentration greater than said first dopant concentration, an oxide region formed in and above a top surface of said semiconductor substrate and encircling an active region in which a circuit element is formed; and a field plate formed on said oxide region and encircling said active region, said field plate having a first end and a second end, said method comprising:

coupling said first end of said field plate to a first power supply terminal; and coupling said second end of said field plate to said first region.

17. The method of claim 16, wherein said first power supply terminal is coupled to an input pad of said semiconductor device for receiving a Vdd voltage for said semiconductor device.

18. The method of claim 16, wherein said first power supply terminal is coupled to an input pad of said semiconductor device for receiving a Vss voltage of said semiconductor device.

19. The method of claim 18, wherein said Vss voltage comprises a ground voltage.

* * * * *